United States Patent [19]
Hanrahan et al.

[11] Patent Number: 5,431,571
[45] Date of Patent: Jul. 11, 1995

[54] ELECTRICAL CONDUCTIVE POLYMER MATRIX

[75] Inventors: James R. Hanrahan, Springfield, Pa.; Daniel D. Johnson, Hockessin, Del.

[73] Assignee: W. L. Gore & Associates, Inc., Newark, Del.

[21] Appl. No.: 156,203

[22] Filed: Nov. 22, 1993

[51] Int. Cl.⁶ .................. H01R 4/00; B32B 27/00
[52] U.S. Cl. .................. 439/91; 439/591; 439/927; 428/308.4; 428/901; 428/422; 174/88 R; 29/830
[58] Field of Search .................. 439/91, 591, 927; 428/901, 421, 422, 304.4, 308.4; 174/84 R, 88 R; 29/830

[56] References Cited

U.S. PATENT DOCUMENTS

| | | | |
|---|---|---|---|
| 3,953,566 | 4/1976 | Gore | 264/288 |
| 4,008,300 | 2/1977 | Pomm | 264/104 |
| 4,096,227 | 6/1978 | Gore | 264/210 R |
| 4,449,774 | 5/1984 | Takashi et al. | 339/59 M |
| 4,598,011 | 7/1986 | Bowman | 428/221 |
| 4,606,962 | 8/1986 | Reylek et al. | 428/148 |
| 4,820,376 | 4/1989 | Lambert et al. | 156/643 |
| 4,902,857 | 2/1990 | Cranston et al. | 174/94 R |
| 4,985,296 | 1/1991 | Mortimer, Jr. | 428/220 |
| 4,996,097 | 2/1991 | Fischer | 428/220 |
| 5,001,302 | 3/1991 | Atsumi | 174/94 R |
| 5,045,249 | 9/1991 | Jin et al. | 264/24 |
| 5,084,211 | 1/1992 | Kawaguchi et al. | 252/511 |
| 5,148,806 | 9/1992 | Fukui et al. | 128/639 |
| 5,209,967 | 5/1993 | Wright et al. | 428/283 |
| 5,213,715 | 5/1993 | Patterson et al. | 252/518 |
| 5,328,756 | 7/1994 | Wright et al. | 428/422 |

FOREIGN PATENT DOCUMENTS 549159  2/1994  European Pat. Off.

OTHER PUBLICATIONS

Preliminary Data Sheet, Adhesive Interconnect Systems 5303R Z-Axis Adhesive Film (AZF)-3M Co., Feb. 19, 1992.

*Primary Examiner*—P. Austin Bradley
*Assistant Examiner*—Jeanne M. Elpel
*Attorney, Agent, or Firm*—Gary A. Samuels

[57] ABSTRACT

An electrical interconnect is described which is a structure comprising a polymer matrix of a microstructure of nodes separated by void spaces and being interconnected by fibrils. The nodes are generally aligned elongated columns and have conductive particles embedded in them. The void spaces may be filled with a nonconductive adhesive.

13 Claims, 3 Drawing Sheets

ELECTRICAL CONDUCTIVE POLYMER MATRIX

FIELD OF THE INVENTION

This invention relates to an electrical interconnect for electronic circuitry, and more particularly to interconnects that have electrical conductivity in one plane while being nonconductive in the other two planes.

BACKGROUND OF THE INVENTION

It has long been a goal in the electronics industry to replace soldering and welding as a means of providing an electrical connection between two opposing rows or conductive elements. Connection is needed to connect the traces of one flexible circuit to the traces of another flexible circuit; connect a ribbonized flat cable to a printed circuit board; connect a packaged integrated circuit to a printed circuit board; or the like. Moreover, there is a trend to make more efficient use of board space by closely spacing leads or traces, and by generally diminishing component size and circuitry. Usual connectors, e.g. spring, finger or pin contact are not amenable to the diminished sized components that are common today. Two alternative means for providing electrical connection have been proposed to overcome these problems. They are elastomeric connectors and Z-axis adhesives.

Elastomeric connectors employ conductive bands of metal particle filled elastomeric material disposed between bands of nonconductive elastomeric material. These bands form a bar or strip that has alternating conductive and non-conductive regions. The strip is used to make an electrical connection between two parts by placing it between the row of conductive elements on one part and the opposing row of conductive elements on the other part and applying a normal force, usually by means of a clamp. The bands of conductive elastomer make an electrical connection between the conductive elements on one part and the opposing conductive elements on the other part. The width of each conductive elastomer band is less than the spacing between the individual conductive elements on each part, so the conductive bands make an electrical connection between the opposing elements but not between the individual conductive elements on each part. For example, a row of copper lines on one printed circuit board can be electrically connected to a row of copper lines on another printed circuit board without causing an electrical short within the row of copper lines on the printed circuit boards themselves.

If the electrical connection between two opposing parts needs to be more permanent, or a constant normal force cannot be exerted, then a Z-axis adhesive is utilized. Z-axis adhesives are non-conductive resins filled with conductive particles. They come as either liquids, pastes, or cast films. The Z-axis adhesive is used to mechanically bond and electrically connect the conductive elements on one part and the opposing conductive elements on the other part. The conductive particles are suspended and isolated in the non-conductive resin. The diameter of each conductive particle is substantially less than the spacing of the conductive elements, therefore, there is no shorting between the individual elements. Conversely, the conductive particles have a sufficiently large diameter that they can electrically bridge between the opposing rows of conductive elements to be connected.

Both methods of connection have their limitations. The density of the connection that can be attained by the elastomeric connectors is limited by the spacing of the conductive and non-conductive elements in the elastomeric strip as well as the normal force that must be exerted. The Z-axis adhesive has several limitations based on its ability to keep the conductive particles suspended and isolated in the adhesive. If the particles are not evenly dispersed, they can cause shorting between the conductive elements. If they are not large enough or are not in sufficient concentration, there will not be sufficient conductivity between the conductive elements to be connected. Also, if the adhesive flows or is smeared during processing, the conductive adhesive may cause shorting of other components. Another problem with the Z-axis adhesive is achieving the right balance of adhesion, conductivity, reparability, and compliance.

In some embodiments, a single conductive particle is used to provide the electrical path between two opposing conductive elements. In this type of connector, uniformity of particle size is critical to ensure adequate contact, since the degree to which two opposing conductive elements can be pressed together will depend on the diameter of the larger size particle in the elastomeric connector. It would be beneficial to have a connector that did not depend on the criticality of particle size for operation.

SUMMARY OF THE INVENTION

This invention addresses these deficiencies by providing an electrical interconnect structure comprising a polymer matrix of a microstructure of nodes separated by void spaces and being interconnected by fibrils. The nodes are generally irregularly aligned elongated columns and have conductive particles embedded in them.

In another embodiment, the void spaces are filled with a nonconductive adhesive. Thus the conductive particles are locked into the nodes and not into the adhesive.

The resulting structure is an excellent Z-axis adhesive because the function of the adhesive resin is separated from the function of the conductive regions. If the adhesive flows or is smeared during processing it does not cause shorting because it is not conductive. There is no danger of the conductive particles agglomerating or becoming unevenly dispersed because they are firmly locked into the non-conductive matrix. Also, there is a great deal more flexibility in the choice of adhesive resin because the resin does not have to balance the often competing requirements of suspending the conductive particles, providing good adhesion, compliance, and repairability.

BRIEF DESCRIPTION OF THE DRAWINGS

FIG. 4b is a scanning electron micrograph taken along the thickness (x-axis) of the same interconnect as in FIG. 4a.

DETAILED DESCRIPTION OF THE INVENTION

The polymer matrix is a lattice comprising a microstructure of a plurality of generally aligned elongated columns of solid material (nodes) interconnected by fibrils but separated so as to define void space in the microstructure, said solid material having conductive material, e.g., particles, embedded therein, said fibrils and void space being substantially free of conductive material. The matrix is compressible.

The conductive regions can be as small as 5 microns in width, surrounded by voids that can be just as small. The conductive density of the material of the invention is high. The conductive regions are non-spherical as opposed to spherical regions in many art materials; therefore, the conductive area in the Z-axis can be much longer than the width which results in improved conductivity between the conductive elements without shorting the traces on the substrate.

Figure 1:
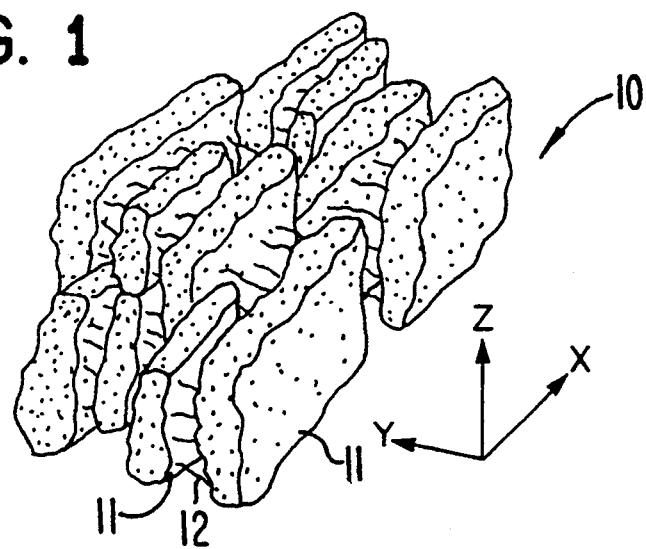
FIG. 1 is a schematic representation of the microstructure of an interconnect material of the invention.

Referring to FIG. 1, the electrical interconnect material 10 is comprised of nodes 11 interconnected by fibrils 12. The nodes are arranged in generally parallel rows extending lengthwise along the Y-axis and extending in the Z-axis at least partially throughout the thickness of the material. The conductive material is represented by dots inside nodes 11.

The interconnect material can be made of any material, but is preferably made of an organic polymer that can be processed to form the lattice network described above. Such polymers include stretchable polymers such as ultra high molecular weight polyethylene, fluorinated polymers such as porous polytetrafluoroethylene (PTFE). PTFE is preferred. Preferably the material will be in form of a sheet about 25 microns to 1000 microns thick.

The conductive material present in the solid regions of the lattice is preferably a conductive particulate such as an inorganic material, e.g. carbon black, metal powder or flake or fibers, metal coated spheres, conductive glass or mica, or the like. Particle size can vary from 0.03 micron to 100 microns depending on the size of the matrix.

The preferred interconnect material can be prepared by adding conductive particulate to an aqueous dispersion of PTFE resin at a loading of particulate of generally between 5 and 50 volume percent, preferably 15–35, and extruding the resulting dispersion through a die to form an extrudate. The extrudate is then calendered to form a tape and the lubricant removed by any convenient means, such as heating. Then stretched over platens set at 300°–365° C. in the machine direction at a speed of about 3–40 feet/minute at a stretch ratio of 2:1 to 6:1. The tape can then be stretched in the transverse direction at a speed between 5–30 feet/minute in two heating zones (IR). The tape can then be preheated to 200° C. and passed through an IR zone at about 280°–320° C. and then through a second heating zone at above 360° C. The stretch ratio in both zones was about 2:1 to 4:1. SEM's indicated that the resulting structure was a lattice of microstructure of a plurality of generally aligned elongated columns of solid material (nodes) interconnected by fibrils but separated so as to define void space in the microstructure, with the solid material having conductive material embedded therein. The fibrils and void space are substantially free of conductive material. Void space can range from 25 to 80%.

A sheet adhesive can be made of the above-prepared material by filling the void space with an adhesive resin. Usually the spaces are filled by subjecting the matrix to a solvent containing the adhesive. Representative adhesives include cyanate esters, epoxy resins, and the like.

Figure 2:
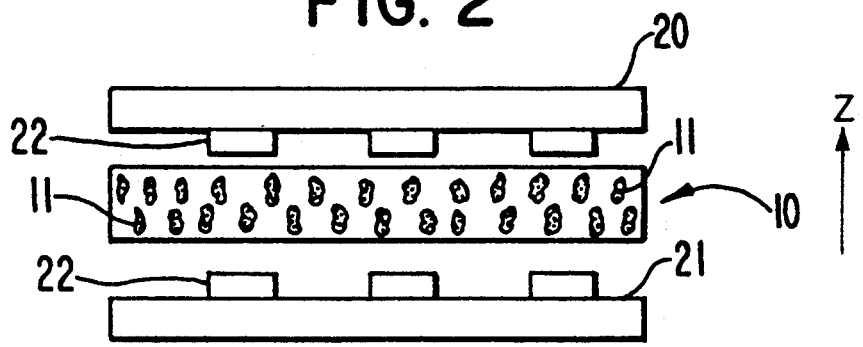
FIG. 2 is an exploded view of the edges of two printed circuit boards with the interconnect material between them.

Referring to FIG. 2, to employ the material as an electrical interconnect, it can be placed between two printed circuit boards 20 and 21 with traces 22 on them. FIG. 2 is an exploded view before contact is made.

Figure 3:
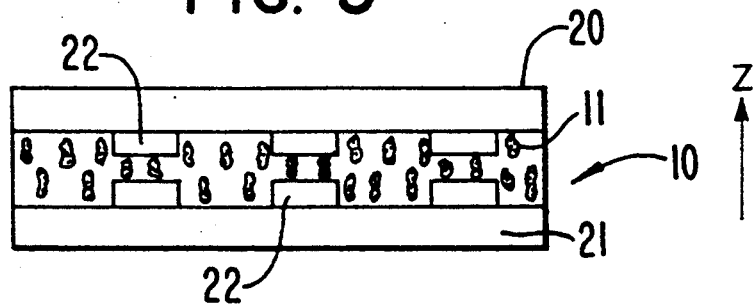
FIG. 3 is a view of the exploded view of FIG. 2, except that the two printed circuit boards have been pressed into the interconnect material to make electrical contact.

In FIG. 3, the conductive material has been compressed between the boards. FIG. 3 shows how the conductive material acts as a conductor. The solid nodes 11 with conductive particles in them are compressed in those areas between the traces and form electrical contact. Conductivity is achieved by mechanical contact of the conductive particles being compressed as the nodes are compressed between the conductive traces on the opposing printed circuit boards.

EXAMPLE 1

A non-conductive matrix with conductive regions was prepared by the following process.

An aqueous dispersion of polytetrafluoroethylene resin (Type AD-1 obtained from ICI, Ltd. was filled with a 15% loading by volume of carbon-block conductive particles (Ketjenblack EC 3005 from Akzo Corp.).

The aqueous dispersion of PTFE and carbon black was co-coagulated. The carbon black had a particle size of about 0.03 micrometers. The coagulum was then dried at 160° C. for 24 hours.

An extrusion aid (Isopark) was compounded with the coagulum at a level of 0.67 lbs./lb. by tumble mixing. The compounded material was then extruded through a rectangular die to make a tape form. The tape was then calendered to a final thickness of 6 mils and the lubricant removed by heating to above 200° C.

The tape was stretched in the machine direction at a ratio of 3:1 and at a speed of 4 feet per minute. The tape was then stretched in the transverse direction at a ratio of 3:1 and at a speed of 25 fpm. This resulted in a final film thickness of between 3 to 4 mils.

Figure 4A:
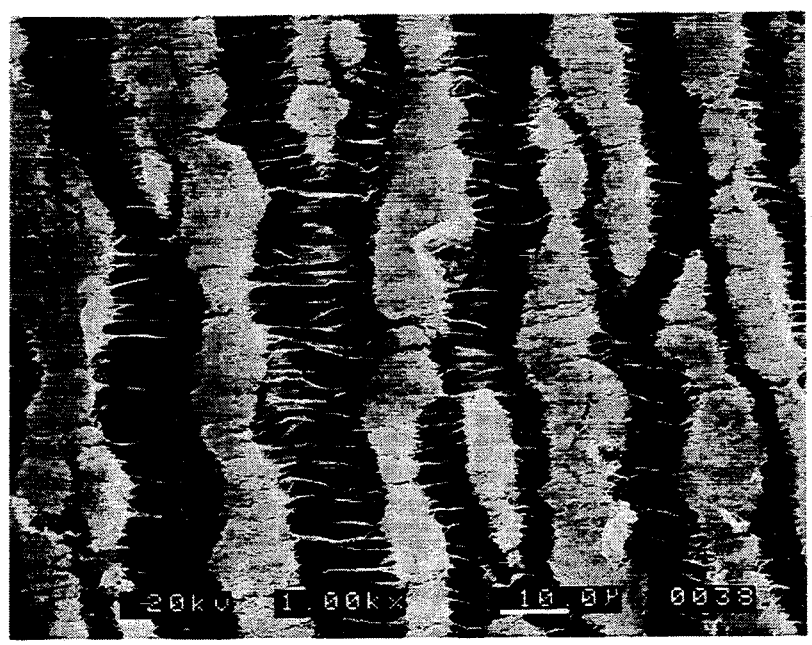
FIG. 4a is a scanning electronic micrograph of the top surface of an interconnect of the invention.
Figure 4B:
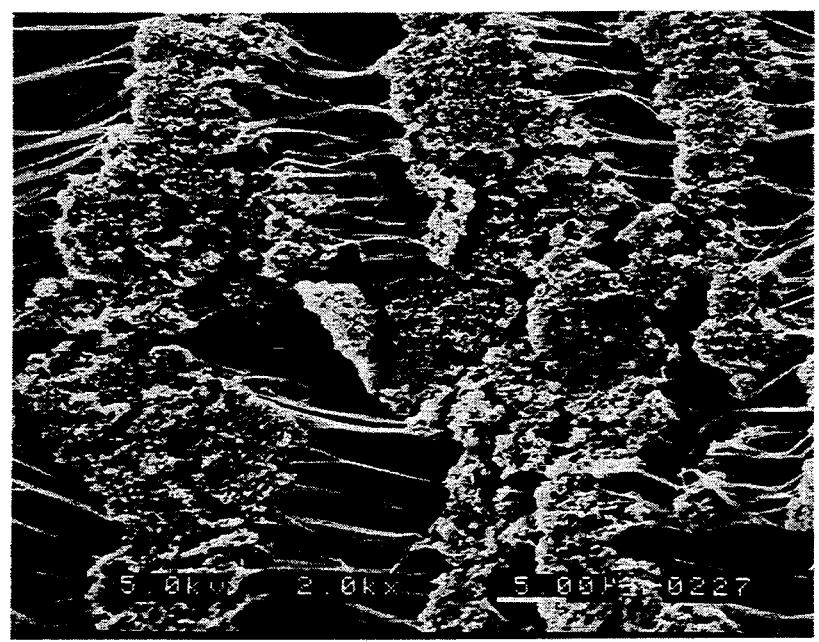
Figure 5:
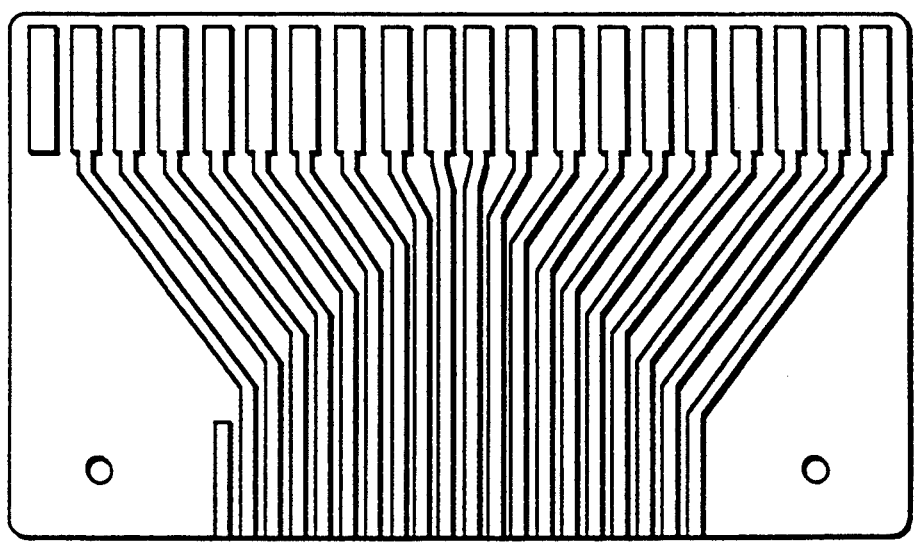
FIG. 5 is top view of a printed board trace used in Examples 2 and 3.

Scanning electron micrographs showed that the resulting film had nodal regions which contained conductive particles and these nodal regions were surrounded by regions containing fibril and void spaces that were substantially free of conductive particles. These are depicted in FIGS. 4a and 4b in which FIG. 4a is taken from the top of film and FIG. 4b is taken along the thickness (x-axis). The film was tested for conductivity and found to conduct an electrical current through the thickness of the film, but did not conduct electricity in the transverse or down web directions.

The test for conductivity was carried out according to MIL-G-83528, section 4.6.10. Probes used were 1 square inch in area, and film thickness was 3 mils, unconditioned.

Resistance through the Z-direction was determined by pressure probe using a Hewlett-Packard HP 3478A multimeter. Three measurements were made and the resistance was determined to be 1.2 ohms, 1.1 ohms, and 1.2 ohms.

Resistivity of the surface was carried out as per section 4.6.11. The resistivity was measured in the X and Y directions. In both directions the resistance was greater than 20 mega ohms.

EXAMPLE 2

A portion of the film was placed between two printed circuit boards having 2 mil thick parallel conductive traces on 25 mil centers. The film was located between the two printed circuited boards and the assembly taped together. An electrical current was passed from one board to the other board through the thickness of the film. Tests for electrical conductivity using a Fluke Multimeter showed that there was conductivity between corresponding circuit traces on each board, while there was substantially no conductivity between adjacent circuit traces. These results are summarized in Table 1.

TABLE 1

| Measurement # | Resistance Z-direction (ohms) | X-Y Resistance (1 trace away) (ohms) | X-Y Resistance (2 traces away) |
|---|---|---|---|
| 1 | 1.5 | $6.3 \times 10^6$ | Open |
| 2 | 1.8 | Open | Open |
| 3 | 1.3 | $6.1 \times 10^6$ | Open |

EXAMPLE 3

The above film was impregnated with a non-conductive epoxy resin using a solvent coating process. The film was heated at 160° C. and cured to a semi-cured state of dryness. The resulting sheet adhesive had a resin content of 30%. A sample was taken from both the machine and transverse direction of the sheet adhesive. Each sample was placed between two printed circuit boards with parallel conductive traces. The samples were clamped under pressure and heated at 225° C. for 1.5 hours until the adhesive cured. The two printed circuit boards were firmly bonded together. Tests for electrical conductivity used a Keithley 580 micro-ohmmeter having a 4 wire resistance probe, showed that there was conductivity between corresponding circuit traces, on each board, while there was substantially no conductivity between adjacent circuit traces. These results are summarized in Table 2.

TABLE 2

| Measurement # | Resistance Z-direction (ohms) | X-Y Resistance (1 pad away) (ohms) | X-Y Resistance (2 pads away) (ohms) |
|---|---|---|---|
| Sample 1 - Longitudinal or Machine Direction | | | |
| 1 | 2.03 | $11.98 \times 10^3$ | $23.78 \times 10^3$ |
| 2 | 5.37 | $13.43 \times 10^3$ | $23.51 \times 10^3$ |
| 3 | 3.86 | $11.76 \times 10^3$ | $23.3 \times 10^3$ |
| Sample 2 - Transverse Direction | | | |
| 1 | .70 | 326 | 939 |
| 2 | 2.1 | 616 | 1098 |
| 3 | 1.02 | 347 | 684 |

We claim:

1. A composition which comprises a planar material having x, y and z axes comprising a polymer matrix of a plurality of generally aligned elongated columns of solid nodular material interconnected by fibrils but separated so as to define void space in the microstructure, said solid material having conductive material embedded therein, said fibrils and void space being substantially free of conductive material.

2. The composition of claim 1 in the form of a sheet having electrical conductivity in one plane while being substantially non-conductive in the other two planes.

3. The composition of claim 1 or 2 in which the polymer matrix is comprised of stretched, porous polytetrafluoroethylene.

4. The composition of claim 3 in which the conductive particles are carbon black.

5. An electrical elastomeric connector made of the composition of in claim 1.

6. A composition which comprises a planar material having x, y and z axes comprising a polymer matrix of a plurality of generally aligned elongated columns of solid nodular material interconnected by fibrils but separated so as to defined void space in the microstructure, said solid material having conductive material embedded therein, said fibrils and void space being substantially free of conductive material; and said void space being substantially filled with a nonconductive polymeric resin.

7. The composition of claim 6 in the form of a sheet having electrical conductivity in one plane while being substantially non-conductive in the other two planes.

8. The composition of claim 6 or 7 in which the polymeric resin is an uncured adhesive.

9. The composition of claim 6 or 7 in which the polymeric resin is a cured adhesive.

10. In combination a pair of opposed, spaced-apart conductive members, and a generally planar interconnect sandwiched between the conductive members and in contact therewith, the interconnect comprising a polymer matrix of a plurality of generally aligned elongated columns of solid nodular material interconnected by fibrils but separated so as to define void space in the microstructure, said solid material having conductive material embedded therein, said fibrils and void space being substantially free of conductive material.

11. A method for establishing electrical connection between two opposed conductive members comprising the step of sandwiching an interconnect structure between the opposed conductive members, said interconnect structure comprised of a polymer matrix of a plurality of generally aligned elongated columns of solid nodular material interconnected by fibrils but separated so as to define void space in the microstructure, said solid material having conductive material embedded therein, said fibrils and void space being substantially free of conductive material; and causing an electrical current to flow through the interconnect structure from one opposing conductive member to the other.

12. In combination, a pair of opposed, spaced-apart conductive members, and a generally planar interconnect structure, said interconnect structure being sandwiched between the conductive members and in contact therewith, the interconnect structure comprising a polymer matrix of a plurality of generally aligned elongated columns of solid nodular material interconnected by fibrils but separated so as to define void space in the microstructure, said solid material having conductive material embedded therein, said fibrils and void space being substantially free of conductive material, and said void space being substantially filled with a nonconductive adhesive.

13. A method for establishing electrical connection between two opposed conductive members comprising the step of sandwiching a polymer interconnect structure between the opposed conductive members, said interconnect structure comprising a polymer matrix of a plurality of generally aligned elongated columns of solid nodular material interconnected by fibrils but separated so as to define void space in the microstructure, said solid material having conductive material embedded therein, said fibrils and void space being substantially free of conductive material, and said void spaces being substantially filled with a nonconductive adhesive; and causing an electrical current to flow through the interconnect structure from one opposing conductive member to the other.

* * * * *